US011424743B2

(12) United States Patent
Staude

(10) Patent No.: US 11,424,743 B2
(45) Date of Patent: Aug. 23, 2022

(54) OPERATOR CONTROL DEVICE FOR A VEHICLE AND METHOD FOR OPERATING SUCH AN OPERATOR CONTROL DEVICE

(71) Applicant: VALEO Schalter und Sensoren GmbH, Bietigheim-Bissingen (DE)

(72) Inventor: Sascha Staude, Bietigheim-Bissingen (DE)

(73) Assignee: Valeo Schalter und Sensoren GmbH, Bietigheim-Bissingen (DE)

( * ) Notice: Subject to any disclaimer, the term of this patent is extended or adjusted under 35 U.S.C. 154(b) by 699 days.

(21) Appl. No.: 15/748,429

(22) PCT Filed: Jul. 29, 2016

(86) PCT No.: PCT/EP2016/068171
§ 371 (c)(1),
(2) Date: Jun. 13, 2018

(87) PCT Pub. No.: WO2017/017255
PCT Pub. Date: Feb. 2, 2017

(65) Prior Publication Data
US 2018/0287607 A1 Oct. 4, 2018

(30) Foreign Application Priority Data

Jul. 30, 2015 (DE) ...................... 10 2015 112 444.0

(51) Int. Cl.
*H03K 17/96* (2006.01)
(52) U.S. Cl.
CPC . *H03K 17/9622* (2013.01); *H03K 2017/9602* (2013.01); *H03K 2017/9613* (2013.01);
(Continued)
(58) Field of Classification Search
None
See application file for complete search history.

(56) References Cited

U.S. PATENT DOCUMENTS

| 3,879,618 A | 4/1975 | Larson |
| 8,866,491 B2 | 10/2014 | Ksondzyk et al. |

(Continued)

FOREIGN PATENT DOCUMENTS

| CN | 104035227 A | 9/2014 |
| DE | 10 2007 039 609 A1 | 2/2009 |

(Continued)

OTHER PUBLICATIONS

International Search Report issued in PCT/EP2016/068171 dated Feb. 24, 2017 (3 pages).
Written Opinion of the International Searching Authority issued in PCT/EP2016/068171 dated Feb. 24, 2017 (11 pages).
(Continued)

*Primary Examiner* — Andre L Matthews
(74) *Attorney, Agent, or Firm* — Osha Bergman Watanabe & Burton LLP

(57) ABSTRACT

An operator control device for a vehicle, and a method for operating such an operator control device is disclosed. The operator control device is for controlling safety-relevant functions. To this end, the operator control device has at least one user interface having at least one user input panel for user input and a sensor system for identifying a user input in the area of the user input panel, wherein the sensor system has at least one capacitive sensor device having a first, electrically conductive sensor structure and a second, capacitive sensor device having a second, electrically conductive sensor structure, the sensor structures being arranged beneath the user interface in the area of the user input panel. The first sensor structure and the second sensor structure are each configured in comb-like and/or meanderous fashion and arranged in intermeshing fashion at least in a subarea of the user input panel.

28 Claims, 6 Drawing Sheets

Figure 1:
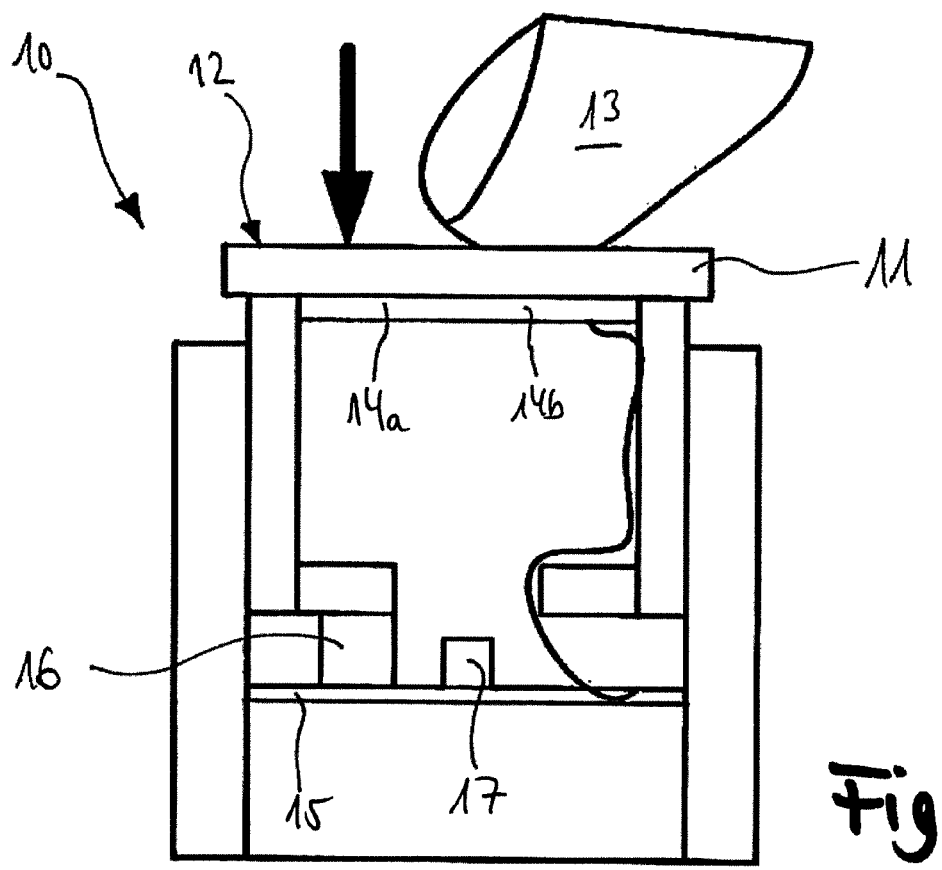

(52) U.S. Cl.
CPC ........... *H03K 2017/9615* (2013.01); *H03K 2217/960705* (2013.01); *H03K 2217/960725* (2013.01); *H03K 2217/960765* (2013.01); *H03K 2217/960775* (2013.01); *H03K 2217/960785* (2013.01)

(56) References Cited

U.S. PATENT DOCUMENTS

| | | |
|---|---|---|
| 2006/0158041 A1 | 7/2006 | Caldwell et al. |
| 2008/0246723 A1 | 10/2008 | Baumbach |
| 2010/0181180 A1 | 7/2010 | Peter |
| 2012/0074961 A1 | 3/2012 | Herrmann |
| 2012/0227259 A1* | 9/2012 | Badaye ............ G09G 3/3611 29/846 |
| 2013/0088372 A1 | 4/2013 | Lundstrum et al. |
| 2013/0270899 A1 | 10/2013 | Buttolo et al. |
| 2015/0248180 A1* | 9/2015 | Wakuda ............ G06F 3/04166 345/174 |
| 2016/0344386 A1* | 11/2016 | Buttolo ............ H03K 17/955 |

FOREIGN PATENT DOCUMENTS

| | | |
|---|---|---|
| DE | 10 2011 011 769 A1 | 8/2012 |
| DE | 10 2013 215 719 B3 | 1/2015 |
| DE | 10 2014 117 823 A1 | 6/2016 |
| WO | 2013106773 A2 | 7/2013 |
| WO | 2015/038282 A1 | 3/2015 |

OTHER PUBLICATIONS

Sennan Search Report issued in DE 10 2015 112 444.0 dated Jul. 28, 2016 (14 pages).

The First Office Action issued in corresponding Chinese Application No. 201680053605 4, dated Oct. 12, 2020 (12 pages).

* cited by examiner

OPERATOR CONTROL DEVICE FOR A VEHICLE AND METHOD FOR OPERATING SUCH AN OPERATOR CONTROL DEVICE

The invention relates to an operator control device for a vehicle, particularly an operator control device for controlling safety-relevant functions, wherein the operator control device has at least one user interface having at least one user input panel for user input and a sensor system for identifying a user input in the area of the user input panel. In this case, the sensor system has at least one first, capacitive sensor device having a first, electrically conductive sensor structure and a second, capacitive sensor device having a second, electrically conductive sensor structure, the sensor structures being arranged beneath a user interface in the area of the user input panel.

Moreover, the invention relates to a method for operating an operator control device as described above.

Operator control devices having user interfaces having sensor systems having capacitive sensor devices for identifying a user input are fundamentally known from the prior art. In particular, operator control devices having capacitive sensor devices for identifying a user input are known that have an input screen as a user interface, for example from DE 10 2011 011 769 A1 or DE 10 2007 039 609 A1.

In capacitive sensor devices, a user input is identified in this case on the basis of what is known as the "capacitive principle", which involves an approach by a human hand or a finger, particularly contact with the user interface, in the detection area of the associated sensor structures causing a change in the capacitive coupling of the relevant sensor structure to the surroundings and, if present, to a reference electrode, the change in the capacitive coupling being able to be registered by means of metrology. From the registered change in the capacitive coupling of the sensor structure to the surroundings and/or to the reference electrode, it is then possible to infer a user input. To register the capacitive coupling of a sensor structure to the surroundings and/or to a reference electrode or the change in a capacitive coupling, the prior art has various methods available. The registering of the capacitive coupling can fundamentally be measured, by way of example, by means of a resonant circuit or using a charging process, in which a current change is registered, for example, or by means of other appropriate suitable methods. Furthermore, for other applications a method is known that has been developed by the company "Microchip", what is known as the CVD (Capacitive Voltage Divider) method, which is based on a simple voltage measurement, what is known as the CVD self method involving a change in the capacitive coupling of the sensor structures to the surroundings being registered, and what is known as the CVD mutual method involving a change in the capacitive coupling of the sensor structure to a reference electrode being registered.

In safety-relevant systems, it is important to identify an erroneous response from the sensors used for signal capture or from the signal paths of said sensors promptly in order to be able to transfer the system to a safe state. In this context, the prior art discloses various fault detection mechanisms, it being known practice, in particular to capture the safety-relevant signals in redundant fashion, to which end at least one respective additional sensor is usually provided whose expected sensor signal is captured and evaluated as independently as possible and can be plausibilized with the sensor signal of the other sensor using various methods, in particular by means of comparison. If the sensor signal appears to be implausible, a fault state is identified and the system is transferred to the safe state.

Moreover, the prior art discloses the practice of purposely stimulating the individual sensors and comparing and plausibilizing the subsequently generated and captured sensor signals with the expected signal values.

In particular in the case of operator control devices having at least one input screen as a user interface, above all in the case of touchscreens, correct identification of a user input is a great challenge, since, unlike in the case of mechanical user input devices or standard switches, no mechanical user input operation is caused that can be identified explicitly and easily by means of appropriate switches, but rather just a mere approach towards or unintentional contact with the input screen can lead to a change in the capacitive coupling, even if no user input is desired.

It is an object of the invention to provide an alternative user input device and also an alternative method, in particular an improved user input device and also an improved method, that provide a simple way of allowing the control of safety-relevant functions, even in operator control devices having an input screen as a user interface, so that the operator control device can be used to control safety-relevant functions.

This object is achieved by an operator control device according to the invention and by a method according to the invention as claimed in the respective independent patent claims. Advantageous embodiments of the invention are the subject matter of the dependent patent claims, the description and the figures.

An operator control device according to the invention is characterized in that the first sensor structure and the second sensor structure are each configured in comb-like and/or meanderous fashion and arranged in intermeshing fashion at least in a subarea of the user input panel.

Such a configuration of the individual sensor structures and the comb-like arrangement thereof allows particularly advantageous redundant identification of a user input to be achieved in a simple manner, since two respective sensor structures are arranged in the area of a common control panel.

In one advantageous configuration of an operator control device according to the invention, the sensor structures in this case are each arranged in a plane beneath the user interface in the area of the user input panel, preferably in a plane parallel to the user interface, particularly in a common plane.

In a further advantageous configuration of an operator control device according to the invention, the user interface has multiple user input panels, wherein each user input panel has an associated sensor system for identifying a user input in the area of the associated user input panel. In this case, each sensor system associated with the user input panel preferably has at least one first, capacitive sensor device having a first, electrically conductive sensor structure and a second, capacitive sensor device having a second, electrically conductive sensor structure, the sensor structures in particular each being arranged beneath the user interface of the associated user input panel and preferably each being configured in comb-like and/or meanderous fashion and arranged in intermeshing fashion in a subarea of the associated user input panel.

That is to say that, as a preference, if the user interface has multiple user input panels, each user input panel has an associated sensor system as described above having at least one first capacitive sensor device having a first sensor structure and a second capacitive sensor device having a second sensor structure, the sensor structures each being configured in comb-like and/or meanderous fashion and arranged in intermeshing fashion.

As a preference, at least one user interface is formed by at least one input screen in this case, each input screen being able to have multiple user input panels.

As a preference, at least two first sensor structures or two second sensor structures of two sensor systems are electrically connected to one another, and as a particular preference, the first sensor structures or the second sensor structures are respectively connected to one another. As a result, the respective sensor structure that extends over multiple sensor systems can be used for multiple sensor systems as a control sensor, as a result of which simple plausibilization of the captured sensor signals is possible in a particularly simple manner.

In a further advantageous configuration of an operator control device according to the invention, at least one sensor system is configured to register, in comparison with a reference state, a respective change in the capacitive coupling of the first sensor structure to the surroundings and/or a reference electrode and a change in the capacitive coupling of the second sensor structure to the surroundings and/or a reference electrode, particularly a change in the capacitive coupling that is caused as a result of a user input in the area of the user input panel.

In a particularly advantageous configuration of an operator control device according to the invention, the sensor system is configured such that to register the change in the capacitive coupling of at least one sensor structure to the surroundings, in a first scanning cycle a reference capacitance and a measurement capacitance, formed by the sensor structure and the surroundings, can each be charged with a defined electrical potential in a first step, the reference capacitance being able to be charged with a first defined potential and the measurement capacitance being able to be charged with a second, defined electrical potential. Further, the sensor system is configured such that the reference capacitance and the measurement capacitance formed by the sensor structure and the surroundings can be shorted in a further step, and the resulting electrical potential arising between the measurement capacitance and the reference capacitance can be registered as a sensor signal in a further step, the resulting electrical potential arising on the basis of the first and second electrical potentials and also on the basis of the magnitude of the reference capacitance and on the basis of the magnitude of the measurement capacitance. In this case, the measurement capacitance can be charged by virtue of a defined electrical potential being applied to the sensor structure.

For particularly accurate registering of the change in the capacitive coupling of the sensor structure to the surroundings, the above-described first two steps of the first scanning cycle can be repeated in every detail.

In a further preferred configuration of an operator control device according to the invention, the sensor system is configured such that in a further scanning cycle, preferably in a second and/or third and/or fourth scanning cycle, the reference capacitance can be charged with the second electrical potential and the measurement capacitance can be charged with the first electrical potential in the first step, the reference capacitance and the measurement capacitance formed by the sensor structure and the surroundings can be shorted in a further step, and the resulting electrical potential arising between the measurement capacitance and the reference capacitance can be registered as a sensor signal in a further step, the resulting electrical potential arising on the basis of the first and second potentials and also on the basis of the magnitude of the reference capacitance and on the basis of the magnitude of the measurement capacitance. That is to say that, as a preference, the relevant capacitances are charged inversely in a second or a further scanning cycle that preferably follows the first scanning cycle. As a result, the registering accuracy can be improved still further.

As a particular preference, in particular also, the first two steps of the last-described scanning cycle are repeated, since this allows even better registering accuracy to be achieved, in particular a higher signal resolution. This is advantageous, in particular, if the internal reference capacitance is distinctly larger than the external capacitance or if the internal reference capacitance is distinctly smaller than the external capacitance, that is to say if the reference capacitance and the measurement capacitance have distinctly different magnitudes.

In a particularly advantageous configuration of an operator control device according to the invention, at least one sensor system has a reference electrode, in particular additionally, wherein the reference electrode can have a defined electrical potential applied to it and the sensor system is configured such that a user input in the area of the user input panel causes a registerable change in the capacitive coupling of the sensor structure of the reference electrode in comparison with a reference state. Preferably, the sensor system is configured to register this change in the capacitive coupling of the sensor structure to the reference electrode.

In a further advantageous configuration of an operator control device according to the invention, the sensor system is configured such that in a further scanning cycle, preferably in a second and/or third and/or fourth scanning cycle, in particular additionally, the reference electrode can have a defined electrical potential applied to it in a first step, and the capacitive coupling of at least one sensor structure to the reference electrode can be registered in a further step.

It has been found to be particularly advantageous in this case if the operator control device or at least one sensor system is configured to register the change in the capacitive coupling of at least one sensor structure to the surroundings and the change in the capacitive coupling of this sensor structure to the reference electrode in succession, preferably in turn, in particular alternately, wherein preferably, in particular for the purpose of signal plausibilization and/or for the purpose of evaluation of whether a user input has been made, the ascertained changes in the capacitive couplings can each be offset against one another.

By way of example, a change in the capacitive coupling of at least one sensor structure to the surroundings can be registered over two scanning cycles and subsequently a change in the capacitive coupling of this sensor structure to the reference electrode or to the surroundings and the reference electrode can be registered over two scanning cycles, the order naturally being arbitrary.

Such combined registering of the capacitive coupling of at least one sensor structure, namely firstly to the surroundings and secondly to the reference electrode or to the surroundings and the reference electrode, allows the registering accuracy to be increased considerably. In particular, the resolution, above all the sensitivity of the sensor device or the accuracy therefor, can be distinctly improved thereby. Moreover, measurement errors and steady-state offsets or the like can be removed in a simple manner.

In a further advantageous configuration of an operator control device according to the invention, at least one sensor structure of at least one sensor system can also be connected and operated as a reference electrode. Preferably, both the first sensor structure and the second sensor structure can be connected as a reference electrode, in particular in turn. In this case, the second sensor structure can preferably be operated as a reference electrode if the change in the capacitive coupling of the first sensor structure is registered, and vice versa. If the sensor system has more than two sensor structures, preferably all of the sensor structures are each connectable and operable as a reference electrode. Therefore, no additional electrode is required for the reference electrode, which allows particularly inexpensive manufacture of an operator control device according to the invention.

In a further advantageous configuration of an operator control device according to the invention, at least one sensor system has a screening device having at least one screening element, wherein the screening device is configured to screen the first sensor device and/or the second sensor device from perturbing capacitive couplings to components of the operator control device. In this case, the screening element is preferably formed by an electrically conductive screening structure that is arranged in particular between the electrical sensor structure of the first sensor device and the second sensor structure of the second sensor device of the sensor system. In particular, it has been found to be advantageous if the screening device is formed by an electrical conductor or an electrode structure that runs, preferably in meandering fashion, between the first sensor structure and the second sensor structure.

In a particularly advantageous configuration of an operator control device according to the invention, the screening element can have a defined, electrical potential, preferably a potential that is at least sometimes tracked to a potential applied to the sensor structure during the registering of the change in the capacitive coupling of the sensor structure, particularly a potential that follows the profile of the potential applied to the sensor structure, applied to it during registering of the change in the capacitive coupling of at least one sensor structure.

In a further advantageous configuration of an operator control device according to the invention, at least one sensor structure of at least one sensor system can also be connected as an active screening element, wherein preferably the first sensor structure and the second sensor structure can each be connected as an active screening element, in particular in turn. If the sensor system has more than two sensor structures, then preferably all of the sensor structures are each connectable and operable as an active screening element. In this manner, it is not necessary to provide an additional screening element, which allows particularly inexpensive manufacture of an operator control device according to the invention.

In a preferred configuration of an operator control device according to the invention, at least one sensor system has not only the first capacitive sensor device and the second capacitive sensor device but also at least one further sensor device for identifying a user input in the area of the user input panel associated with the sensor system, preferably a pressure-sensitive sensor device, such as a microswitch, a rubber mat contact, a pressure contact or a force sensor, for example. In this manner, threefold-redundant identification of a user input is possible and the probability of misidentification by the two capacitive sensor devices is distinctly reduced and therefore the safety of the operator control device is increased.

In a particularly advantageous configuration, in particular to meet certain safety requirements, at least one sensor system is configured to register the change in the capacitive coupling of the sensor structure of the first capacitive sensor device and of the sensor structure of the second sensor device of the sensor system to the surroundings and/or to a reference electrode at the same time or to register said change at such slightly staggered times that safety-relevant plausibilization of the captured sensor signals is possible.

In a further advantageous configuration of an operator control device according to the invention, at least one sensor system is configured to register the change in the capacitive coupling of the sensor structure of a capacitive sensor device to the surroundings and/or to a reference electrode only if a user input has been identified beforehand during the registering of the change in the capacitive coupling of the sensor structure of the other capacitive sensor device to the surroundings and/or to a reference electrode. That is to say, in other words, that in an advantageous configuration of an operator control device according to the invention, the change in the capacitive coupling of the second sensor structure, for example, is registered only if a user input has been identified beforehand by means of the first sensor device. In this manner, a wake-up circuit can be realized with only one sensor device, which allows the power consumption of the operator control device to be reduced by almost all half, particularly in standby mode.

In a particularly advantageous configuration, particularly for the control of safety-relevant functions, the operator control device has a monitoring device for identifying a fault state in at least one sensor system, wherein the monitoring device is configured to plausibilize at least one captured sensor signal of at least one sensor device of the sensor system, particularly to plausibilize the sensor signals of all the sensor devices of the sensor system. In this case, the monitoring device identifies a fault if at least one captured and evaluated sensor signal of the sensor system is implausible, the monitoring device preferably being configured to take at least one captured sensor signal of the first sensor device and at least one captured sensor signal of the second sensor device and/or to take the directly successively registered changes in the capacitive coupling of a sensor structure to the surroundings and in the capacitive coupling of this sensor structure to the reference electrode as a basis for identifying whether there is a fault state.

That is to say, in other words, that, as a preference, there is first provision for plausibilization by means of at least one captured sensor signal of the first sensor device by comparison with at least one sensor signal of the second sensor device and/or on the basis of the registered changes in the capacitive coupling of a sensor structure to the surroundings and the reference electrode.

Preferably, the monitoring device is, in particular additionally, configured to identify reciprocal influencing of the first sensor device and the second sensor device of at least one sensor system, in particular a short circuit between the first sensor structure and the second sensor structure, the operator control device preferably being configured to output a fault state if influencing is identified.

In a further advantageous configuration of an operator control device according to the invention, the monitoring device is configured to identify an inadmissible signal value of at least one of the sensor signals, preferably all of the sensor signals, the monitoring device being, in particular, configured to identify a measured value range overshoot and/or an inadmissible signal value within a measured value range. Preferably, the operator control device is in this case likewise configured to output a fault state if an inadmissible signal value is identified.

In a further advantageous configuration of the operator control device, the monitoring device is configured to identify whether one of the captured sensor signals is constant for longer than a predefined period, that is to say has not changed. This fault detection is normally also referred to as timeout identification, wherein preferably, if a timeout is identified, an error message can be sent and the system can be transferred to a safety state.

In a further advantageous configuration of an operator control device according to the invention, a signal filter device for filtering the captured signals is further provided in order to achieve better evaluation quality.

In a particularly advantageous configuration, the operator control device has a lighting device having at least one light-emitting source for lighting the back of at least one user input panel, wherein the at least one light-emitting source is preferably arranged in a plane beneath at least one sensor structure of the sensor system associated with the control panel. In this case, the light-emitting source is preferably arranged beneath the sensor structure of the first capacitive sensor device and beneath the sensor structure of the second capacitive sensor device of the sensor system associated with the control panel.

As a preference, the light-emitting source is arranged on a printed circuit board in this case and the sensor structure is in a plane oriented, above the printed circuit board, preferably parallel to the printed circuit board plane. The first and second sensor structures may in this case be arranged on a back of the component forming the user interface, for example on the back of a glass plate forming the user interface, or else on a separate layer that may be formed by a further glass plate or a thin transparent film or a plastic cap or the like, for example.

As a particular preference, at least one sensor structure of the sensor system, preferably the first and the second sensor structure, that is to say both sensor structures, in particular all the structures of the sensor system, are configured and/or arranged such that a beam path from the at least one light-emitting source to the control panel is not blocked.

That is to say, in other words, that at least one sensor structure, preferably all of the structures of the sensor system, are arranged and configured such that the light emitted by the light-emitting source can radiate to the user input panel unimpeded. In this case, preferably all of the other structures, such as the reference electrode or the screening element, for example, are also configured and/or arranged accordingly. Further, the individual components of the operator control device should be configured and arranged such that a display produced in this manner in the area of the control panel is readable, in particular highly readable. That is to say that the individual components should be configured and arranged and coordinated with one another such that, in particular, a good contrast with the display can be ensured and sufficient sharpness.

In a further advantageous configuration of an operator control device according to the invention, at least one sensor structure of the sensor system, preferably the first and the second sensor structure, in particular all the structures, are configured in such a transparent fashion that they are transmissive at least for a portion of the radiation emitted by the at least one light-emitting source, i.e. in other words that at least one sensor structure is configured such that sufficient emitted light from the light-emitting source can reach the control panel in order to light it from the back.

In a particularly advantageous configuration, at least one sensor structure is manufactured from indium tin oxide or comprises indium tin oxide.

Indium tin oxide, frequently also abbreviated to ITO, is a semiconductive substance that is largely transparent in visible light. It is a mixed oxide that is usually made up of 90% indium (III) oxide ($In_2O_3$) and 10% tin (IV) oxide ($SnO_2$). Indium tin oxide is usually applied to substrates under a high vacuum. The substrates used are in particular glass and plastic films. Normally, application is effected by means of cathode sputtering. Indium tin oxide can alternatively be applied by thermal evaporation, components subjected to vapour-deposition needing to be heated to up to 360° C., which limits applicability above all for plastics.

A further possibility is the sol-gel method, which can be used on thin but extensive layers. In this case, the substrates can be dipped, sprayed, printed or spin-coated. Instead of indium tin oxide, at least one sensor structure may alternatively be manufactured from or comprise fluorine-doped tin oxide (FTO), aluminium-doped tin oxide (AZO) or antimony-doped tin oxide (ATO) or graphene. These materials have the advantage over indium tin oxide that they are much less expensive.

A method according to the invention for operating an operator control device, preferably for operating an above-described operator control device according to the invention, wherein the operator control device has at least one user interface having at least one user input panel for user input and a sensor system for identifying a user input in the area of the user input panel, wherein the sensor system has at least one first, capacitive sensor device having a first, electrically conductive sensor structure and a second, capacitive sensor device having a second, electrically conductive sensor structure, the sensor structures being arranged beneath the user interface in the area of the user input panel, is characterized in that to identify a user input, the change in the capacitive coupling of the first sensor structure to the surroundings and/or a reference electrode and a change in the capacitive coupling of the second sensor structure to the surroundings and/or a reference electrode is registered. In this case, to register the change in the capacitive coupling of at least one sensor structure, preferably both sensor structures, to the surroundings, in a first scanning cycle, a reference capacitance and a measurement capacitance, formed by the sensor structure and the surroundings, are each charged with a defined electrical potential, the reference capacitance being charged with a first, defined electrical potential and the measurement capacitance being charged with a second, defined electrical potential, in a first step. The reference capacitance and the measurement capacitance formed by the sensor structure and the surroundings are shorted in a further step, and the resulting electrical potential arising between the measurement capacitance and the reference capacitance is registered as a sensor signal in a further step. The resulting electrical potential arises in this case on the basis of the first and second electrical potentials and also on the basis of the magnitude of the reference capacitance and on the basis of the magnitude of the measurement capacitance.

In one advantageous embodiment of a method according to the invention, the first two steps of the first scanning cycle are repeated before the reference capacitance and the measurement capacitance are shorted. This allows particularly high registering accuracy to be achieved.

In a further advantageous embodiment of a method according to the invention, in a further scanning cycle, preferably in a second and/or third and/or fourth scanning cycle, the reference capacitance is charged with the second electrical potential and the measurement capacitance is charged with the first electrical potential in the first step. In a further step, the reference capacitance and the measurement capacitance formed by the sensor structure and the surroundings are subsequently shorted and, in a further step, the resulting electrical potential arising between the measurement capacitance and the reference capacitance is registered as a sensor signal, the resulting electrical potential also arising in this scanning cycle on the basis of the first and second potentials and also on the basis of the magnitude of the reference capacitance and on the basis of the magnitude of the measurement capacitance.

If the sensor system has a reference electrode and if the sensor system is configured such that a user input in the area of the user input panel causes a registerable change in a capacitive coupling of the sensor structure to the reference electrode in comparison with a reference state, then preferably in a further scanning cycle, in particular in a second and/or third and/or fourth scanning cycle, in particular additionally, the reference electrode has a defined electrical potential applied to it in a first step, and the capacitive coupling of the sensor structure to the reference electrode is registered in the further step.

As a particular preference, the change in the capacitive coupling of a sensor structure to the surroundings and the change in the capacitive coupling of this sensor structure to the reference electrode are respectively registered in succession, preferably in turn, in particular alternately.

Preferably, at least one sensor structure of at least one sensor system is at least intermittently connected and operated as a reference electrode in this case, while the capacitive coupling of another sensor structure is registered, wherein preferably all of the sensor structures of the sensor system, in particular alternately in turn, are respectively connected as a reference electrode.

If the sensor system has at least one screening device having at least one electrically conductive screening element for screening the first sensor device and/or the second sensor device from perturbing capacitive couplings to components of the operator control device, the screening element preferably has a defined, electrical potential, preferably a potential that is at least sometimes tracked to a potential that is applied to the sensor structure during the registering of the change in the capacitive coupling of the sensor structure, particularly a potential that follows the profile of the potential applied to the sensor structure, applied to it during registering of the change in the capacitive coupling of at least one sensor structure of the sensor system.

In one advantageous embodiment of a method according to the invention, at least one sensor structure of at least one sensor system is at least intermittently operated as an active screening element in this case, preferably all of the sensor structures of a sensor system, in particular in turn, are respectively operated as a screening element, a respective sensor structure having a potential applied to it that is at least sometimes tracked to a potential applied to the other sensor structure during the registering of the change in the capacitive coupling of the other sensor structure, in particular follows this potential.

Preferably, the change in the capacitive coupling of the sensor structure of the first capacitive sensor device and of the sensor structure of the second capacitive sensor device of the sensor system to the surroundings and/or to a reference electrode are registered at the same time or at such slightly staggered times that safety-relevant plausibilization of the captured sensor signals is possible, wherein preferably a user input in a user input panel is registered by means of all the sensor devices of the sensor system associated with the user input panel at the same time or at slightly staggered times.

That is to say, in other words, that preferably all of the sensor devices of a sensor system that are associated with a user input panel are used at the same time to identify a user input or are evaluated at such slightly staggered times that safety-relevant plausibilization of the captured sensor signals is possible.

In a particularly advantageous embodiment of a method according to the invention, the change in the capacitive coupling of the sensor structure of a sensor device to the surroundings and/or to a reference electrode is registered only if a user input has been identified beforehand by means of a further sensor device, in particular by means of the other capacitive sensor device.

Preferably, when a user input on a user input panel is identified, a function associated with the user input panel is triggered, the function being triggered in particular only if no fault state in the sensor system and/or in the operator control device has been identified.

If the user interface of the operator control device has multiple user input panels, wherein each user input panel has an associated sensor system for identifying a user input in the area of the associated user input panel, wherein each sensor system associated with a user input panel has at least one first, capacitive sensor device having a first, electrically conductive sensor structure and a second, capacitive sensor device having a second, electrically conductive sensor structure, and the sensor structures each being arranged beneath the user interface of the associated user input panel, when a user input has been identified, a function is triggered only if the user input has been identified only in a single user input panel of the user interface. That is to say that when a user input has been identified in multiple user input panels, no function is triggered. Alternatively, it is naturally also possible for a function to be triggered only if a user input is identified in multiple, defined user input panels.

If the operator control device has a monitoring device for identifying a fault state in at least one sensor system, then preferably the monitoring device is used to plausibilize at least one sensor signal of at least one sensor device of at least one sensor system, wherein a fault state is identified if at least one captured and evaluated sensor signal is implausible, a fault state preferably being identified if at least one captured sensor signal of the first sensor device is implausible by comparison with at least one captured sensor signal of the second sensor device and/or if the directly successively registered changes in the capacitive coupling of at least one sensor structure to the surroundings and in the capacitive coupling of this sensor structure to the reference electrode are implausible.

Preferably, a function is triggered only if all of the sensor signals of the sensor devices of a sensor system are plausible, to which end the captured sensor signals are preferably ANDed.

Such evaluation is naturally not limited to the first capacitive sensor device and the second capacitive sensor device, but rather it is possible in particular for further sensor devices, such as in particular pressure-sensitive sensor devices, for example force sensors, rubber mat sensors, microswitches, etc., to be taken into consideration as well.

Preferably, a fault state in at least one sensor system, in particular as a result of reciprocal influencing of the first sensor structure and the second sensor structure, is identified by virtue of a short-circuit test being performed, with a fault state being identified in the event of a positive result. In order to perform the short-circuit test, a defined potential is preferably applied to one sensor structure and the potential of the other sensor structure is registered. If the registered potential corresponds to the applied potential, then short circuit can be assumed, whereas there is no short circuit if the potentials are different.

Preferably, the short-circuit test described above is performed not only to register reciprocal influencing of the first and second sensor structures, particularly to register a short circuit between the first and second sensor structures, but rather in each case also to check whether there is a short circuit between one of the sensor structures and another component, for example earth (GND), the supply voltage or another line structure. To this end, the potential of the sensor structure to be checked and the present potential of the associated structure are preferably each registered accordingly. If the potential registered on the sensor structure to be checked corresponds to the potential of the respective structure, for example the earth electrode, the supply voltage electrode or the like, then there is possibly a short circuit with the relevant structure, whereas there is no short circuit if the potentials are different.

In a further advantageous embodiment of a method according to the invention, a fault state in at least one sensor system is identified, preferably an inadmissible signal value of at least one of the sensor signals is identified, in particular a measured value range overshoot and/or an inadmissible signal value in a measured value range is identified, by virtue of the captured signal value of at least one sensor signal being compared with admissible signal values, wherein a fault state is identified if an inadmissible signal value is identified.

Moreover, one advantageous embodiment of a method according to the invention can involve a fault state being identified by virtue of a check being performed to determine whether one of the captured sensor signals is constant for longer than a predefined period, that is to say has not changed during this period, with the fault state being identified if at least one of the captured signals is constant for longer than the predefined period. In this way, what is known as timeout identification can be performed.

Further features of the invention are evident from the claims, the figures and the description of the figures. All features and feature combinations mentioned above in the description and the features and feature combinations mentioned below in the description of the figures and/or shown in the figures alone are usable not only in the combination respectively indicated but also in other combinations or else by themselves.

Some of the cited features and properties relate both to an operator control device according to the invention and to a method according to the invention. Some of these features and properties are sometimes described only once, but apply, independently of one another within the framework of technically possible configurations, both to an operator control device according to the invention and to a method according to the invention. The preferred embodiments, and advantages thereof, presented with reference to the operator control device therefore accordingly also apply to a method according to the invention, and vice versa.

The invention will now be explained in more detail on the basis of preferred exemplary embodiments, particularly with reference to the accompanying drawings, in which.

Figure 2:
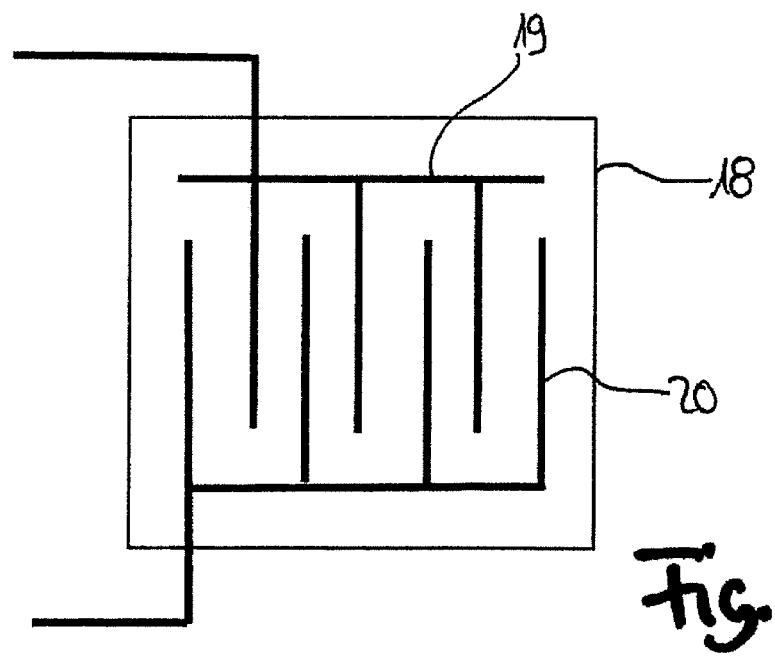
Figure 3:
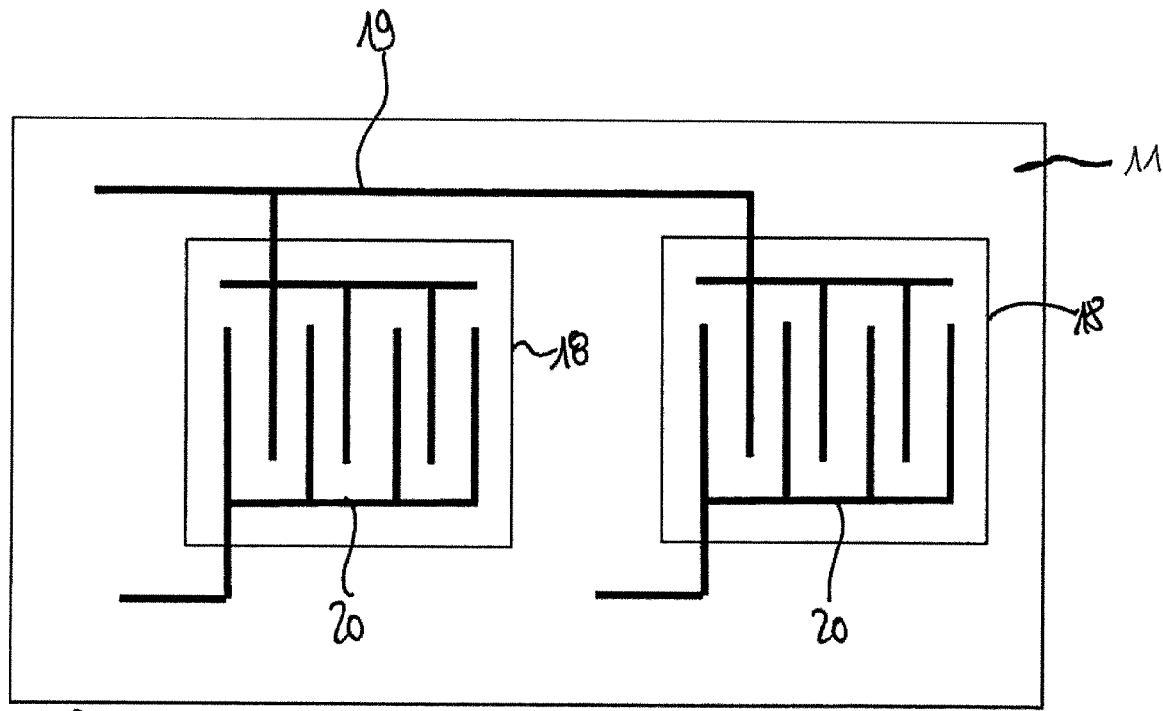
Figure 4:
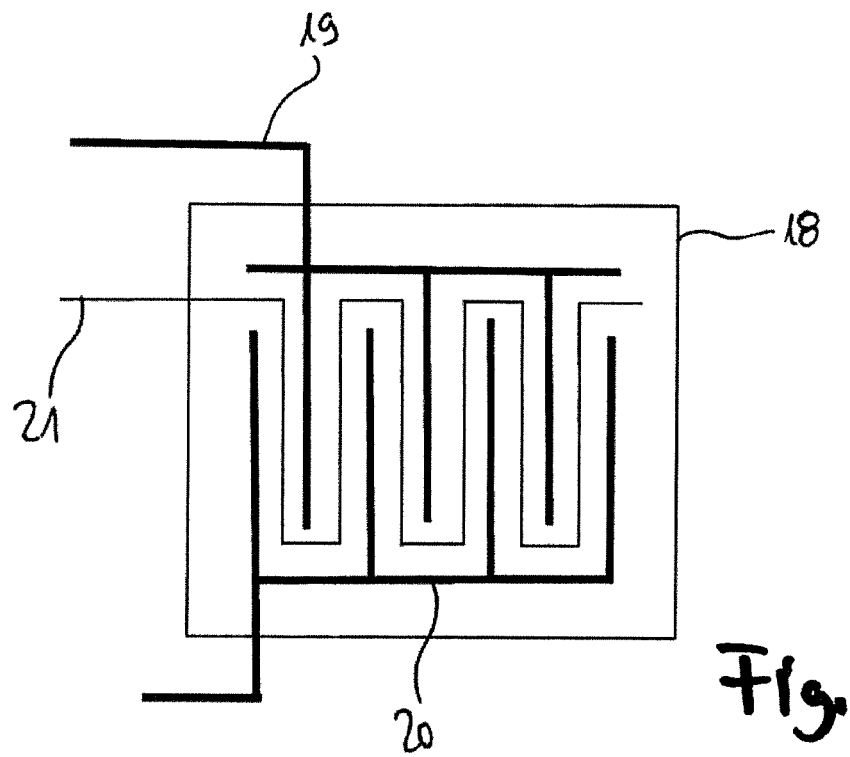
Figure 5:
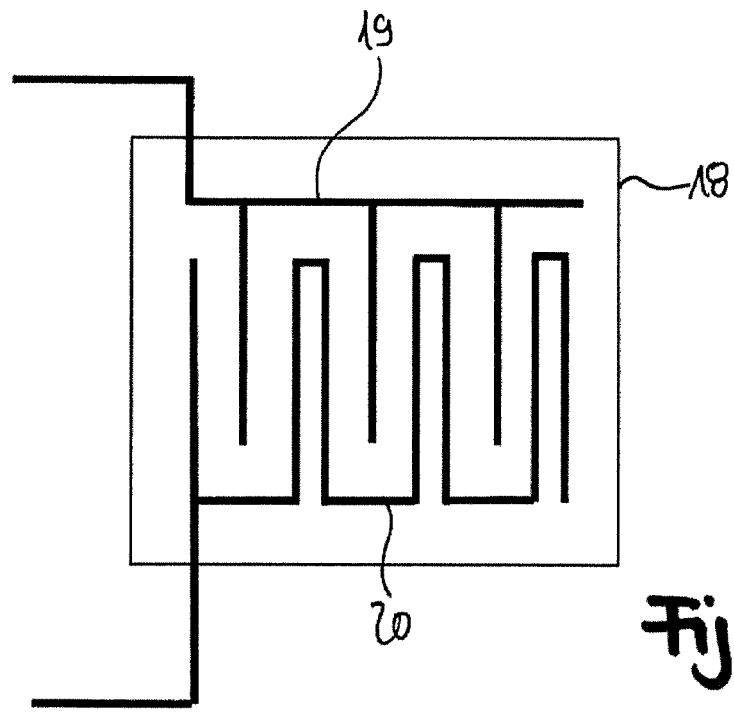
Figure 6:
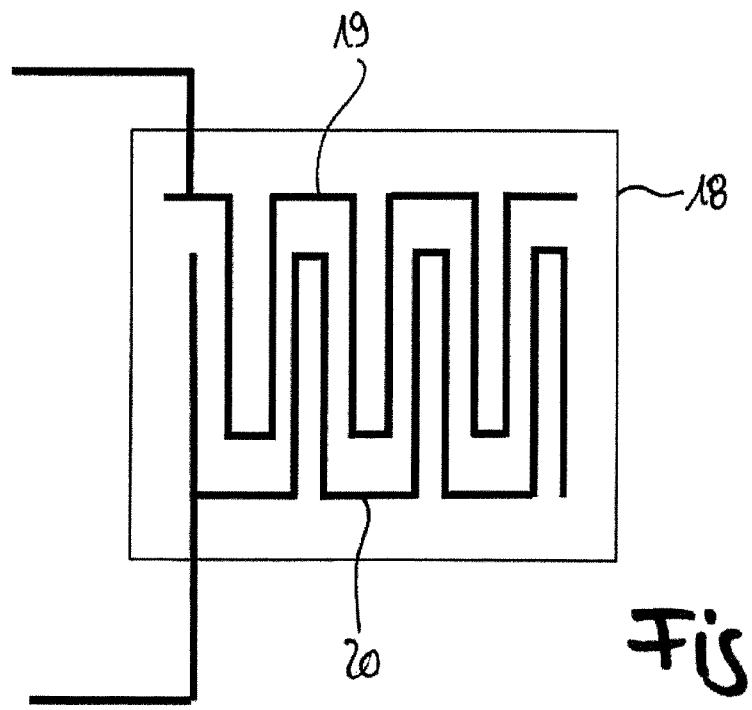
Figure 7:
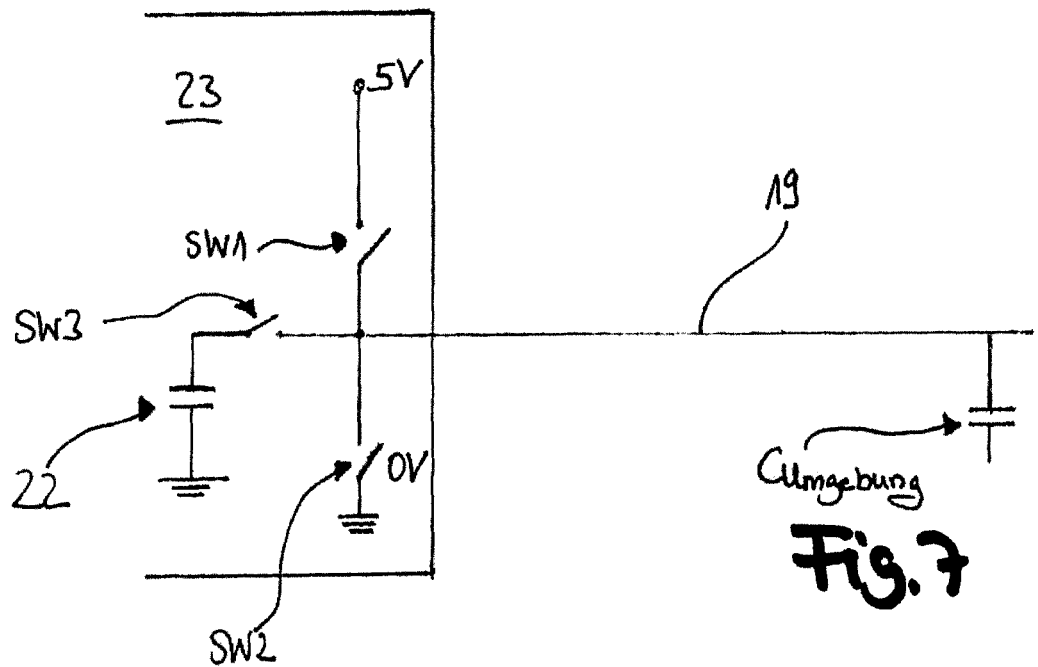
Figure 8:
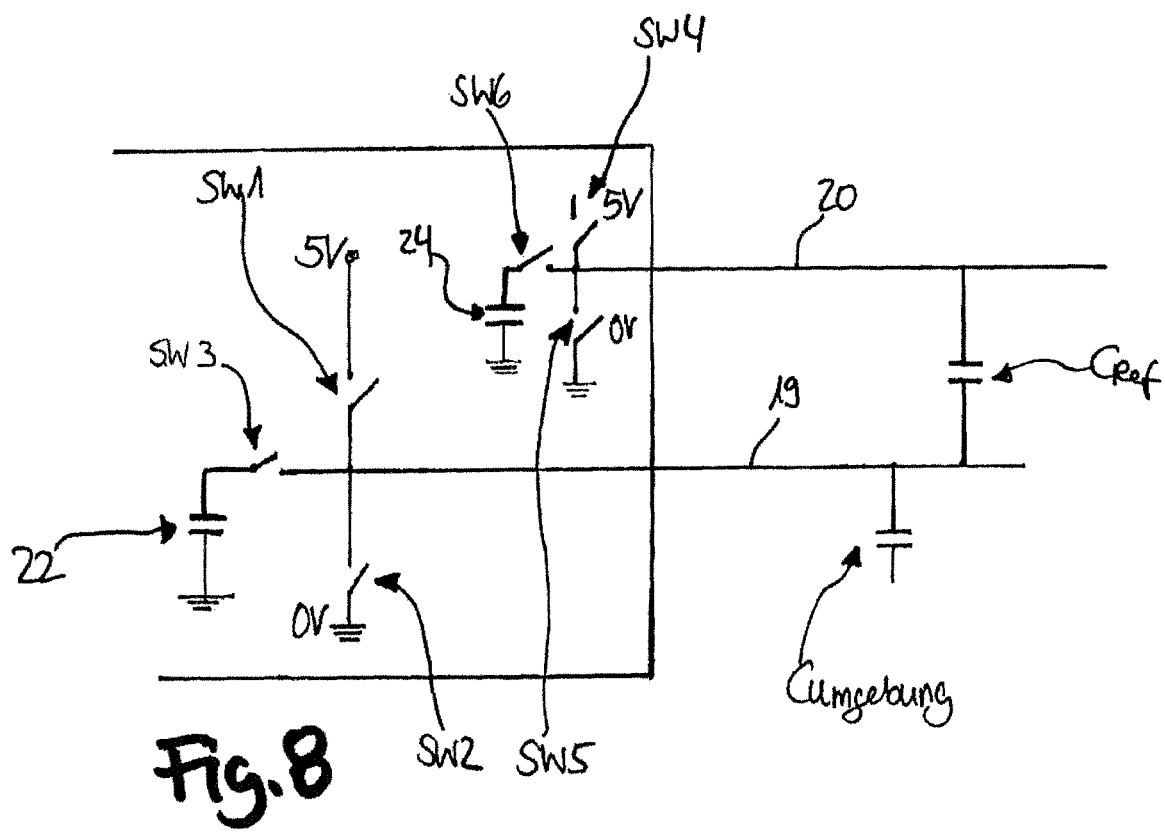
Figure 9:
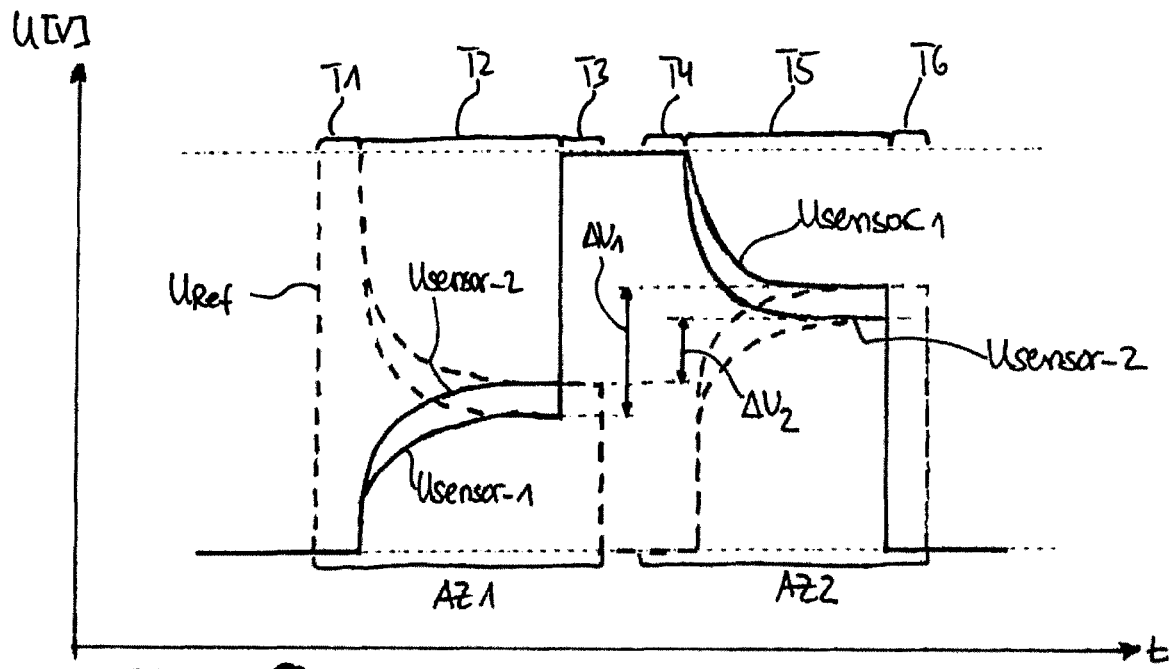
Figure 10:
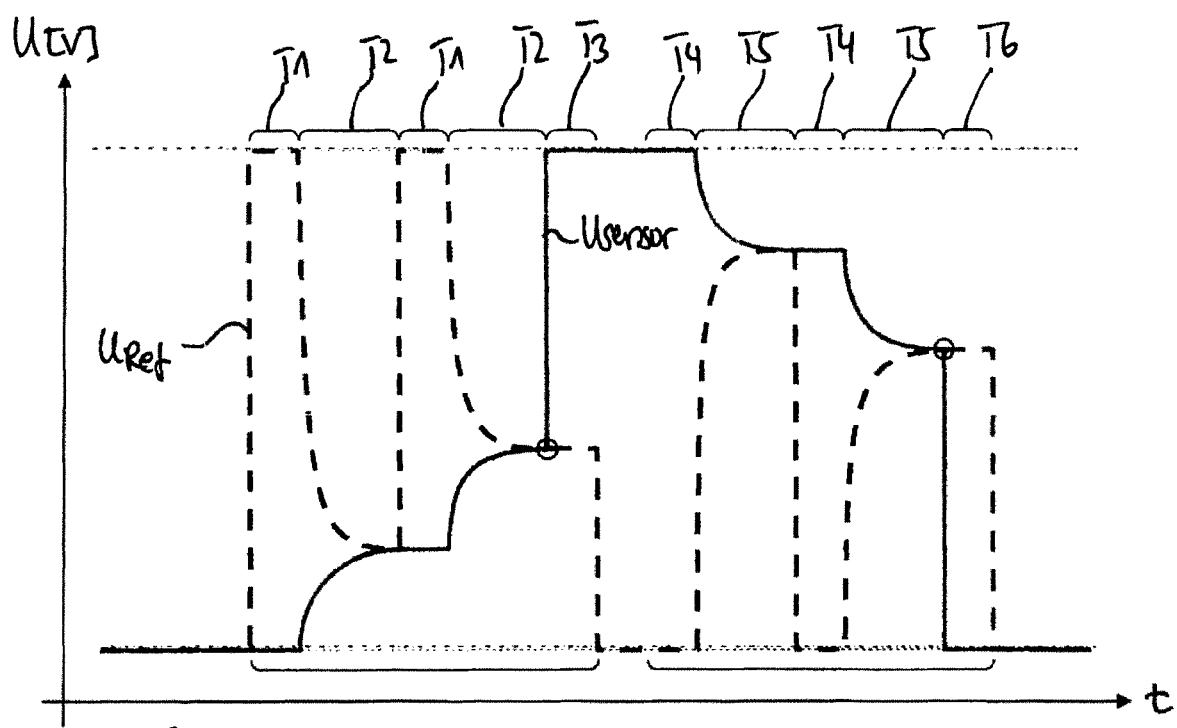
Figure 11:
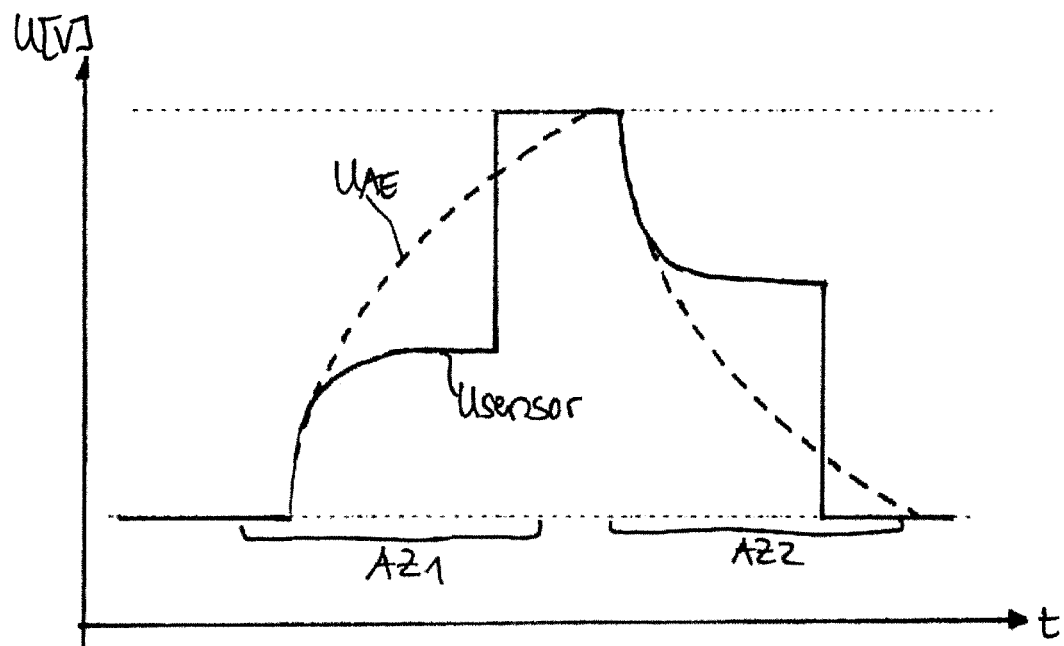
Figure 12:
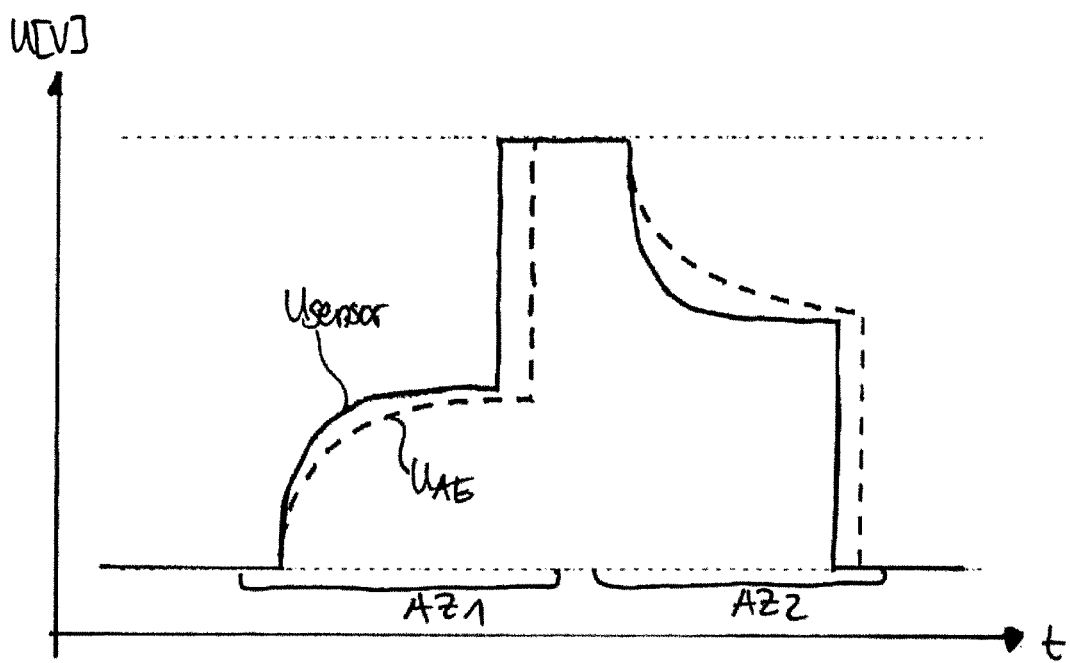

FIG. 1 shows a schematic depiction of a section through an exemplary embodiment of an operator control device according to the invention, FIG. 2 schematically shows a plan view of the configuration and arrangement according to the invention of the sensor structures of the capacitive sensor devices of the operator control device according to the invention from FIG. 1, FIG. 3 schematically shows a possible, alternative configuration and arrangement of the sensor structures for an alternative exemplary embodiment of an operator control device according to the invention, FIGS. 4 to 6 schematically show possible, alternative configurations and arrangements of the sensor structures for an alternative exemplary embodiment of an operator control device according to the invention, FIG. 7 shows a detail from a schematic block diagram of a capacitive sensor device for an operator control device according to the invention in order to clarify the manner of operation of the capacitive sensor device, FIG. 8 shows a detail from a schematic block diagram of a sensor system of the operator control device according to the invention from FIG. 1, FIG. 9 schematically shows the profile of the electrical potential applied to a sensor structure of the operator control device according to the invention during the registering of a change in the capacitive coupling of a sensor structure to the surroundings, FIG. 10 schematically shows the profile arising in contrast to FIG. 9 for the electrical potential applied to the sensor structure of the capacitive sensor device when steps T1 and T2 and also T4 and T5 are respectively repeated during the registering of the change in the capacitive coupling, FIG. 11 shows an advantageous profile of a tracked electrical potential of an active screening element, FIG. 12 shows a particularly advantageous profile of an electrical potential of an active screening element, the potential of the screening element in this case, in contrast to FIG. 10, following the profile of the electrical potential applied to the sensor structure.

FIG. 1 shows an exemplary embodiment of an operator control device 10 according to the invention having an input screen 11 as a user interface 12, a user input being possible by using a finger 13 to touch the user interface 12 in the manner of a keystroke. In this case, the operator control device 10 according to the invention is provided for the purpose of controlling various, including safety-relevant, functions in a vehicle.

This exemplary embodiment of an operator control device 10 according to the invention has a sensor system having multiple sensor devices 14a, 14b and 16, the sensor devices 14a and 14b each being capacitive sensor devices 14a, 14b while the sensor device 16 is a pressure-sensitive sensor device in the form of a force sensor.

The sensor devices 14a, 14b and 16 of the sensor system of the operator control device according to the invention are each electronically coupled to a printed circuit board, the printed circuit board having a microcontroller—not depicted here—for evaluating the captured sensor signals.

From FIG. 2, which schematically shows a plan view of the configuration and arrangement according to the invention of the sensor structures 19 and 20 of the capacitive sensor devices of the operator control device according to the invention from FIG. 1, it is possible to see that the capacitive sensor devices 14a and 14b each have a sensor structure 19 and 20, respectively, beneath a user input panel 18 associated with the sensor devices 14a and 14b, the first capacitive sensor device 14a having the sensor structure 19 associated with it and the sensor structure 20 being associated with the capacitive sensor device 14b. The sensor structures 19 and 20 in this arrangement are each mounted on the back of the glass plate of the input screen 11 that forms the user interface 12.

According to the invention, the first sensor structure 19 and the second sensor structure 20 in this arrangement are each formed by electrical conductors configured in comb-like fashion that are arranged in intermeshing fashion in a common plane parallel to the user interface 12.

The first sensor device 14*a* and the second capacitive sensor device 14*b* in this arrangement are each configured to identify a touch of the user interface 12 in a respective common user input panel 18 associated with the two sensor devices 14*a* and 14*b*, whereas the pressure-sensitive sensor device 16 does not react just to mere touching of the user interface 12, but rather reacts only when the finger 13 is used to apply a pressure exceeding a threshold value to the user interface 12 or the associated user input panel.

The identification of a user input by means of the capacitive sensor devices 14*a*, 14*b* is effected on the basis of what is known as the "capacitive principle" in this case, which involves an approach by a human hand or a finger 13, in particular a touch of the user interface 12, in the detection area of the associated sensor devices 14*a*, 14*b* causing a change in the capacitive couplings of the relevant sensor structures 19, 20 to the surroundings and, if present, to a reference electrode, the change in the capacitive coupling being able to be registered by metrology. From the registered changes in the capacitive couplings of the sensor structures 19, 20 to the surroundings and/or to the reference electrode, it is then possible to infer a user input.

In this exemplary embodiment of an operator control device according to the invention, the user interface 12 is further lit, the lighting of the user interface 12 being provided by a light-emitting source 17 arranged at the back in the form of an LED that is configured to illuminate the user interface 12 from the back, the user interface 12 being of accordingly transparent configuration, so that the light is also perceived as lighting by a user.

So that the rays of light emitted by the light-emitting source are not blocked by the sensor devices 14*a* and 14*b*, in particular the sensor structures 19, 20 thereof, the latter are of accordingly translucent configuration and in particular manufactured from indium tin oxide and vapour-deposited on the back of the user interface 12.

The respective comb-like configuration according to the invention and the meshing arrangement of the first sensor structure 19 and the second sensor structure 20 beneath an associated, common user input panel 18 allows redundant registering of a user input in a simple manner, the sensor structures 19 and 20 being arranged at such a short distance from one another that every user input results in a change in the capacitive coupling of the two sensor structures 19, 20 to the surroundings and/or a reference electrode. The microcontroller—not denoted in more detail here—on the printed circuit board 15 can be used to evaluate the two captured sensor signals of the first sensor device 14*a* and the second sensor device 14*b* in parallel. In particular, a redundant evaluation required for safety-relevant functions is possible, the captured sensor signals first being able to be compared with one another and secondly being able to be used for reciprocal plausibilization.

The sensor structures 19 and 20 in this arrangement are used not only for registering capacitive coupling to the surroundings and/or to a reference electrode, not depicted here, but rather can furthermore at least each be connected as an active screening element and as a reference electrode.

FIG. 3 schematically shows a possible, alternative configuration and arrangement of the sensor structures 19 and 20 for an alternative exemplary embodiment of an operator control device according to the invention, wherein in this exemplary embodiment the input screen 11 has two user input panels 18, each user input panel 18 having an associated sensor system with in each case a first sensor structure 19 and a second sensor structure 20. The sensor structures 19 and 20 of a sensor system are each arranged beneath the associated user input panel 18 and each configured in comb-like fashion and each arranged in intermeshing fashion, so that respective redundant registering of a user input by means of the first sensor structure 19 and the second sensor structure 20 is possible in each user input panel 18.

To simplify the design of an operator control device according to the invention, the first sensor structures 19 are respectively connected to one another, so that only one connection contact is necessary for electrical coupling to the printed circuit board 15 and the microcontroller. A further advantage of a common sensor structure 19 is that this sensor structure 19 can be used as a control sensor for all of the sensor systems of the operator control device 10 at the same time, which allows particularly simple and effective plausibilization of the captured sensor signals.

FIGS. 4 to 6 schematically show further possible, alternative configurations and arrangements of the sensor structures 19 and 20 for an operator control device according to the invention, the sensor system shown in FIG. 4 having a meanderously configured, further electrical conductor 21 provided between the first sensor structure 19 and the second sensor structure 20, which further electrical conductor is likewise arranged in the same plane as the first sensor structure 19 and the second sensor structure 20 in this exemplary embodiment and is connectable and can be operated as an active screening element. To this end, the electrical conductor 21 can in particular have a defined, electrical potential UAE applied to it that is tracked to or follows the sensor signal applied to one of the sensor structures 19 and 20, while the change in the capacitive coupling of at least one sensor structure 19 or 20 to the surroundings and/or to a reference electrode, not depicted here, is registered, cf. FIGS. 11 and 12.

In the case of the sensor structures 19 and 20 shown in FIG. 5, in contrast to the previous exemplary embodiments, the sensor structure 20 is not configured in comb-like fashion like the sensor structure 19, but rather is meanderous, but, according to the invention, likewise arranged so as to mesh with the first sensor structure 19.

FIG. 6 shows a further exemplary embodiment for the configuration and arrangement of the sensor structures 19, 20 of an operator control device according to the invention, with the first sensor structure 19 and the second sensor structure 20 each being configured meanderously in this case, but likewise, according to the invention, being arranged in intermeshing fashion.

In the case of the operator control device according to the invention described above, a user input is identified first by means of the pressure-sensitive sensor device 16 and also by means of the first capacitive sensor device 14*a* and the second capacitive sensor device 14*b* using a method according to the invention.

To clarify the manner of operation of the capacitive sensor devices 14*a* and 14*b*, particularly to explain the method according to the invention, FIG. 7 shows a detail from a schematic block diagram of a capacitive sensor device for an operator control device according to the invention. An associated, exemplary potential profile—arising when a method according to the invention is used—of a potential $U_{Sensor}$ applied to a sensor structure 19 is depicted in FIG. 9.

A user input is identified, in particular the capacitive coupling of a sensor structure is registered, using a method according to the invention, which is subsequently described by way of example on the basis of the sensor structure 19, by virtue of, during a first scanning cycle AZ1, the reference capacitance 22 and the sensor structure 19 capacitively coupled to the surroundings being charged in defined fashion in a first step in the period T1, for example the reference capacitance being charged with 5V and the sensor structure 19, as shown, with 0V, and subsequently the reference capacitor 22 and the sensor structure 19 being shorted in a second step T2. In a third step in a period T3, an evaluation device 23, which in this exemplary embodiment is the microcontroller arranged on the printed circuit board, then registers and evaluates the potential $U_{Sensor}$ arising between the reference capacitance 22 and the sensor structure 19. From the potential $U_{Sensor}$ arising on the sensor structure 19, which potential conveys the capacitive coupling of the sensor structure 19 to the surroundings, it is subsequently possible to infer whether or not there is a human hand or a finger 13 etc. in the detection area of the sensor device 14a or whether or not a user input has been made.

The reference capacitance 22 is charged by virtue of first of all the switches SW1 and SW3 being closed and the switch SW2 being opened. The measurement capacitance $C_{Surroundings}$ is charged by virtue of the switches SW3 and SW1 being opened and the switch SW2 being closed. Once the measurement capacitance $C_{Surroundings}$ is charged, the switch SW2 is subsequently likewise opened again.

The shorting is then effected by closing the switch SW3 and causes the same potential $U_{Sensor}$ to arise on the reference capacitance 22 and the measurement capacitance $C_{Surroundings}$, the resulting electrical potential $U_{Sensor}$ fundamentally arising on the basis of the first and second electrical potentials and also on the basis of the magnitude of the reference capacitance 22 and on the basis of the magnitude of the measurement capacitance $C_{Surroundings}$. If the measurement capacitance $C_{Surroundings}$ is of approximately the same magnitude as the reference capacitance 22, then approximately a potential $U_{Sensor}$ of half the amplitude arises, i.e. in this case an amplitude of 5V prompts a potential of approximately 2.5V to arise on the sensor structure 19.

If there is no human hand or no finger 13 or the like in the detection area of the sensor device or of the sensor structure 19, then a potential profile $U_{Sensor1}$ arises. If, by contrast, there is a human hand or a finger 13 or the like in the detection area of the sensor structure 19, then a different potential profile is obtained, depicted here by the potential profile $U_{Sensor2}$ by way of example. From the potential $U_{Sensor1}$ or $U_{Sensor2}$ that is obtained, it is possible to infer the presence or absence of a human hand 13 in the detection area of the sensor structure 19.

During the registering of the potential $U_{Sensor}$ applied to the sensor structure 19 and to the reference capacitance 22, it is possible, if the switch SW3 is open again, for the sensor structure 19 to already have a defined potential applied to it again, for example for a next scan to identify a user input or for another purpose.

To further improve registering accuracy, it is additionally possible for, in a second scanning cycle AZ2, the reference capacitance 22 also to be subsequently charged with the second electrical potential of 0V and for the measurement capacitance $C_{Surroundings}$ to be charged with the first electrical potential of 5V in the first step T4, that is to say conversely with respect to the first scanning cycle AZ1.

In a further step T5, the reference capacitance 22 and the measurement capacitance $C_{Surroundings}$ formed by the sensor structure 19 and the surroundings are then shorted again and, in a further step T6, it is again possible for the resulting electrical potential $U_{Sensor}$ arising between the measurement capacitance $C_{Surroundings}$ and the reference capacitance 22 to be registered.

As a result, potential differences $\Delta U1$ and $\Delta U2$ are obtained that can be evaluated, instead of absolute potential values $U_{Sensor1}$ and $U_{Sensor2}$, which allows better identification accuracy to be attained. In particular, it is no longer necessary in this case to correct or remove perturbing, steady-state, capacitive couplings affecting the absolute potential values $U_{Sensor1}$ and $U_{Sensor2}$, or to calibrate the sensor device 14a, 14b accordingly in this regard.

To increase registering accuracy, particularly to improve the resolution for measurement and reference capacitances 22 of different magnitude, it is advantageous to repeat the first two steps T1 and T2 and also T4 and T5 of the first scanning cycle AZ1 and of the second scanning cycle AZ2 in each case, see FIG. 10, since in this manner the resulting potential $U_{Sensor}$ approaches half the potential difference.

FIG. 8 shows a detail from a schematic block diagram of the capacitive sensor devices 14a and 14b of the operator control device 10 according to the invention from FIG. 1, wherein, in contrast to the depiction in FIG. 7, which merely serves for explanation, the sensor structure 20 in the case of the operator control device 10 according to the invention is additionally connectable as a reference electrode 20 by means of the switches SW4, SW5 and SW6 and can have a defined electrical potential applied to it, so that the capacitive coupling of the first sensor structure 19 to a reference electrode, which in this case is formed by the second sensor structure 20, can be registered, with a user input in the detection area of the first sensor structure 19 causing a registerable change, associated with the sensor structure 19, in a capacitive coupling $C_{Ref}$ of the sensor structure 19 to the reference electrode 20 in comparison with the reference state.

In this case, it has been found to be particularly advantageous if the reference electrode 20 is connected in a further scanning cycle, particularly in a second scanning cycle AZ2 and/or a third and/or fourth scanning cycle, since this causes an increase in the potential difference $\Delta U_1$ or $\Delta U_2$ when the potential applied to the reference electrode 20 is chosen accordingly, as a result of which a better resolution and hence a higher identification accuracy can be achieved. That is to say that the potential profiles $U_{Sensor1}$ and $U_{Sensor2}$ are then at a different level.

It is particularly advantageous if the change in the capacitive coupling of the sensor structure 19 to the surroundings and the change in the capacitive coupling of the sensor structure 19 to the reference electrode 20 are registered in direct succession, in particular in turn, particularly preferably alternately. This allows a particularly high identification accuracy to be achieved, since a multiplicity of potential values $U_{Sensor1}$ and $U_{Sensor2}$ or potential differences $\Delta U_1$ and $\Delta U_2$ are available that can be offset against one another almost arbitrarily in order to remove or compensate for measurement errors and steady-state offsets or the like and/or to increase the resolution and hence the accuracy or sensitivity of the sensor device.

Preferably, the capacitive coupling of the first sensor structure 19 to the surroundings and to a reference electrode, wherein the second sensor structure 20 forms the reference electrode, and subsequently, but only at such slightly staggered times that plausibilization of the sensor signals of the first and second sensor devices that is required for safety-relevant functions continues to be possible, the capacitive coupling of the second sensor structure 20 to the surroundings and to a reference electrode, wherein in this case the first sensor structure 19 forms the reference electrode, is registered in each case alternately in turn.

If an operator control device according to the invention has an additional screening element, for example, as depicted in FIG. 4, in the form of a further electrical conductor 21 or a sensor structure operable as a screening element, then the screening element has a defined electrical potential, particularly a potential $U_{AE}$ tracked to or following the potential applied to the relevant sensor structure, see FIGS. 11 and 12, applied to it preferably during the registering of the capacitive coupling of a sensor structure to the surroundings and/or to a reference electrode, FIG. 11 schematically showing an exemplary, advantageous profile of a tracked electrical potential $U_{AE}$ that can be applied to an active screening element.

In this case, the potential $U_{AE}$ increases when the potential $U_{Sensor}$ applied to the sensor structure increases and decreases when the potential $U_{Sensor}$ applied to the sensor structure decreases. Such application of potentials to a screening element already allows good screening performance to be achieved.

A potential profile $U_{AE}$ of this kind can be achieved through the use of a sensor system having a microcontroller from the "Microchip" company, for example, by virtue of the relevant screening element being electrically connected to an I/O pin provided specifically for that purpose on the microcontroller. The microcontroller is accordingly configured to apply the shown potential profile to this pin on the basis of the state of the sensor device.

For even better screening, the defined electrical potential $U_{AE}$ applied to the screening element should follow the electrical potential $U_{Sensor}$ applied to the sensor structure as well as possible, preferably as depicted in FIG. 12. FIG. 12 schematically shows the profile of an electrical potential $U_{AE}$ of an active screening element that has almost the same curved profile with almost the same absolute potential values as the electrical potential $U_{Sensor}$ applied to the sensor structure and therefore follows the profile of the electrical potential $U_{Sensor}$ applied to the sensor structure.

This potential profile $U_{AE}$ can likewise be achieved by the use of a sensor system having a microcontroller from the "Microchip" company, the relevant screening element in this case being connected to a different pin provided for that purpose on the microcontroller, specifically to what is known as the "DACOUT" pin. The microcontroller is accordingly configured to apply the shown potential profile to this pin on the basis of the state of the sensor device.

Naturally, a multiplicity of modifications, in particular of design type, are possible without departing from the content of the patent claims.

The invention claimed is:

1. An operator control device controlling safety-relevant functions associated with a vehicle, the operator control device comprising: at least one user interface having at least one user input panel for user input; and a sensor system for identifying a user input in an area of the user input panel, wherein the sensor system comprises a first, capacitive sensor device having a first, electrically conductive sensor structure and a second, capacitive sensor device having a second, electrically conductive sensor structure, the sensor structures being arranged beneath the at least one user interface in the area of the user input panel wherein the first sensor structure and the second sensor structure are each configured in comb-like and meanderous fashion and arranged in intermeshing fashion at least in a subarea of the user input panel, wherein the sensor system is configured to register, in comparison with a reference state, a first electrical potential change of the first sensor structure and a second electrical potential change of the second sensor structure wherein the change in the electrical potential is caused as a result of the user input in the area of the user input panel, wherein the operator control device triggers one of the safety-relevant functions based on the sensor system registering the first electrical potential change and the second electrical potential change staggered times as a provision for safety-relevant plausibilization of captured sensor signals, wherein registering the first electrical potential change comprises:

maintaining, throughout a first time period, the first sensor structure at a first constant electrical potential and a reference capacitor at a second constant electrical potential; electrically connecting, throughout a second time period subsequent to the first time period, the first sensor structure and the reference capacitor together; registering, during a third time period subsequent to the second time period, a first resulting electrical potential of the first sensor structure; maintaining, throughout a fourth time period subsequent to the third time period, the first sensor structure at the second constant electrical potential and the reference capacitor at the first constant electrical potential; electrically connecting, throughout a fifth time period subsequent to the fourth time period, the first sensor structure and the reference capacitor together; registering, during a sixth time period subsequent to the fifth time period, a second resulting electrical potential of the first sensor structure, wherein the first electrical potential change comprises a difference between the first resulting electrical potential and the second resulting electrical potential.

2. The operator control device according to claim 1, wherein the at least one user interface has multiple user input panels each having an associated sensor system for identifying a user input in the area of the associated user input panel, wherein each sensor system associated with a user input panel has at least one first, capacitive sensor device having a first, electrically conductive sensor structure and a second, capacitive sensor device having a second, electrically conductive sensor structure, the sensor structures each being arranged beneath the user interface of the associated user input panel, and wherein the first sensor structure and the second sensor structure are each configured in comb-like and meanderous fashion and arranged in intermeshing fashion at least in a subarea of the associated user input panel.

3. The operator control device according to claim 1, wherein: the sensor system is configured to register the change in the capacitive coupling of at least one sensor structure to the surroundings, in a first scanning cycle a reference capacitance and a measurement capacitance, formed by the sensor structure and the surroundings, are each charged with a defined electrical potential in a first step, the reference capacitance being charged with a first, defined electrical potential and the measurement capacitance being charged with a second, defined electrical potential, the reference capacitance and the measurement capacitance formed by the sensor structure and the surroundings is shorted in a further second step, and the resulting electrical potential arising between the measurement capacitance and the reference capacitance is registered as a sensor signal in a further third step, the resulting electrical potential arising on the basis of the first and second electrical potentials, the magnitude of the reference capacitance and the magnitude of the measurement capacitance ($C_{Surroundings}$).

4. The operator control device according to claim 3, wherein the sensor system is configured such that in a further scanning cycle, the reference capacitance is charged with the second electrical potential and the measurement capacitance is charged with the first electrical potential in the first step, the reference capacitance and the measurement capacitance ($C_{Surroundings}$) formed by the at least one sensor structure and the surroundings are shorted in a further fourth step, and the resulting electrical potential arising between the measurement capacitance and the reference capacitance is registered as a sensor signal in a further fifth step, the resulting electrical potential arising on the basis of the first and second potentials, of the magnitude of the reference capacitance and the magnitude of the measurement capacitance.

5. The operator control device according to claim 1, wherein the reference capacitor comprises a reference electrode that has a defined electrical potential applied to the reference electrode, and the sensor system is configured such that a user input in the area of the user input panel causes a registerable change in a capacitive coupling of at least one sensor structure to the reference electrode in comparison with a reference state.

6. The operator control device according to claim 5, wherein the sensor system is configured such that in a further scanning cycle, the reference electrode has a defined electrical potential applied to it in a first step, and the capacitive coupling of at least one sensor structure to the reference electrode can be registered in a further second step.

7. The operator control device according to claim 1, wherein the sensor system is configured to register the change in the capacitive coupling of at least one sensor structure to the surroundings and the change in the capacitive coupling of this sensor structure to the reference capacitor in succession alternately.

8. The operator control device according to claim 1, wherein at least one sensor system has a screening device having at least one screening element, wherein the screening device is configured to screen the first sensor device or the second sensor device from perturbing capacitive couplings to components of the operator control device, the screening element being formed by an electrically conductive screening structure that is arranged between the first sensor structure of the first sensor device and the second sensor structure of the second sensor device of the sensor system.

9. The operator control device according to claim 8, wherein the screening element can have a defined, electrical potential, that is at least sometimes tracked to a potential applied to the sensor structure during the registering of the change in the capacitive coupling of the sensor structure wherein the potential follows the profile of the potential applied to the sensor structure during registering of the change in the capacitive coupling of a sensor structure of the sensor system.

10. The operator control device according to claim 9, wherein at least one sensor structure of at least one sensor system can also be connected as an active screening element, wherein the first sensor structure and the second sensor structure can each be connected as an active screening element in turn.

11. The operator control device according to claim 1, wherein at least one sensor system has not only the first capacitive sensor device and the second capacitive sensor device but also at least one further sensor device for identifying a user input in the area of the user input panel associated with the sensor system.

12. The operator control device according to claim 1, wherein at least one sensor system is configured to register the change in the capacitive coupling of the sensor structure of a capacitive sensor device to the surroundings or to the reference electrode capacitor only if a user input has been identified beforehand during the registering of the change in the capacitive coupling of the sensor structure of the other sensor device to the surroundings or to the reference electrode capacitor.

13. The operator control device according to claim 1, further comprising a monitoring device for identifying a fault state in at least one sensor system, wherein the monitoring device is configured to plausibilize at least one captured sensor signal of at least one sensor device of the sensor system, to plausibilize the sensor signals of all of the sensor devices of the sensor system, wherein the monitoring device identifies a fault if at least one captured and evaluated sensor signal of the sensor system is implausible, the monitoring device being configured to take at least one captured sensor signal of the first sensor device and at least one captured sensor signal of the second sensor device and to take the directly successively registered changes in the capacitive coupling of a sensor structure to the surroundings and in the capacitive coupling of this sensor structure to the reference electrode capacitor as a basis for identifying whether there is a fault state.

14. The operator control device according to claim 1, wherein the operator control device has a lighting device having at least one light-emitting source for lighting the back of at least one user input panel, wherein the at least one light-emitting source is arranged in a plane beneath at least one sensor structure of the sensor system associated with the control panel, beneath the sensor structure of the first capacitive sensor device and beneath the sensor structure of the second capacitive sensor device of the sensor system associated with the control panel.

15. The operator control device according to claim 14, wherein all the sensor structures of the sensor system are arranged such that a beam path from the at least one light-emitting source to the user input panel is not blocked.

16. The operator control device according to claim 14, wherein all the structures of the sensor system including the first and second sensor structures, are configured in such a transparent fashion that they are transmissive at least for a portion of the radiation emitted by the at least one light-emitting source.

17. The operator control device according to claim 14, wherein at least one sensor structure comprises or is manufactured from indium tin oxide, fluorine-doped tin oxide, aluminium-doped tin oxide, antimony-doped tin oxide or graphene.

18. A method for operating an operator control device that is configured according to claim 1, wherein the operator control device has at least one user interface having at least one user input panel for user input and a sensor system for identifying user input in the area of the user input panel, wherein the sensor system has at least one first, capacitive sensor device having a first, electrically conductive sensor structure and a second, capacitive sensor device having a second, electrically conductive sensor structure, the sensor structures being arranged beneath the user interface in the area of the user input panel, the method comprising:

to identify a user input, registering the change in the capacitive coupling of the first sensor structure to the surroundings or the reference electrode and a change in the capacitive coupling of the second sensor structure to the surroundings or the reference electrode, wherein registering the change in the capacitive coupling of at least one sensor structure to the surroundings comprises, in a first scanning cycle, charging each of a reference capacitance and a measurement capacitance, formed by the sensor structure and the surroundings with a defined electrical potential; charging the reference capacitance with a first, defined electrical potential and the measurement capacitance being charged with a second, defined electrical potential, in a first step; shorting the reference capacitance and the measurement capacitance formed by the sensor structure and the surroundings are shorted in a further second step; and registering the resulting electrical potential arising between the measurement capacitance and the reference capacitance is registered as a sensor signal in a further third step, the resulting electrical potential arising on the basis of the first and second electrical potentials and also on the basis of the magnitude of the reference capacitance and on the basis of the magnitude of the measurement capacitance.

19. The method according to claim 18, further comprising, in a further second scanning cycle, charging the reference capacitance with the second electrical potential and charging the measurement capacitance with the first electrical potential in the first step, shorting the reference capacitance and the measurement capacitance formed by the at least one sensor structure and the surroundings in a further fourth step, and registering the resulting electrical potential arising between the measurement capacitance and the reference capacitance as a sensor signal in a further fifth step, the resulting electrical potential arising on the basis of the first and second potentials and also on the basis of the magnitude of the reference capacitance and on the basis of the magnitude of the measurement capacitance.

20. The method according to claim 18, wherein the sensor system is configured such that a user input in the area of the user input panel causes a registerable change in a capacitive coupling of at least one sensor structure to the reference electrode in comparison with a reference state, wherein, in a further scanning cycle, the reference electrode has a defined electrical potential applied to it in a first step, and the capacitive coupling of the sensor structure to the reference electrode is registered in a further step.

21. The method according to claim 18, wherein at least one sensor system has a screening device having at least one electrically conductive screening element for screening the first sensor device and the second sensor device from perturbing capacitive couplings to components of the operator control device, wherein the screening element has a defined, electrical potential that is at least sometimes tracked to a potential that is applied to the sensor structure during the registering of the change in the capacitive coupling of the sensor structure, wherein the electrical potential follows the profile of the potential applied to the sensor structure, applied to it during registering of the change in the capacitive coupling of at least one sensor structure of the sensor system.

22. The method according to claim 21, wherein both sensor structures of at least one sensor system is intermittently operated in turn as an active screening element.

23. The method according to claim 18, wherein at least the change in the capacitive coupling of the sensor structure of the first capacitive sensor device and of the sensor structure of the second sensor device of the sensor system to the surroundings or to the reference electrode are registered staggered times as a provision for safety-relevant plausibilization of the captured sensor signals, wherein a user input in a user input panel is registered by all the sensor devices of the sensor system of the associated user input panel at staggered times.

24. The method according to at least claim 18, wherein the change in the capacitive coupling of the sensor structure of a sensor device to the surroundings or to the reference electrode is registered only when a user input has been identified beforehand during the registering of the change in the capacitive coupling of the sensor structure of the other sensor device to the surroundings or to the reference electrode.

25. The method according to claim 18, wherein when a user input on a user input panel is identified, a function associated with the user input panel is triggered only if no fault state in the sensor system has been identified.

26. The method according to claim 25, wherein the user interface has multiple user input panels, wherein each user input panel has an associated sensor system for identifying a user input in the area of the associated user input panel, wherein each sensor system associated with a user input panel has at least one first, capacitive sensor device having a first, electrically conductive sensor structure and a second, capacitive sensor device having a second, electrically conductive sensor structure, the sensor structures each being arranged beneath the user interface of the associated user input panel, wherein when a user input has been identified, a function is triggered only if a user input has been identified only in a single user input panel.

27. The method according to claim 18, wherein the operator control device has a monitoring device for identifying a fault state in at least one sensor system, wherein the monitoring device is used to plausibilize at least one sensor signal of at least one sensor device of at least one sensor system, wherein a fault state is identified if at least one captured and evaluated sensor signal is implausible, a fault state being identified if at least one captured sensor signal of the first sensor device is implausible by comparison with at least one captured sensor signal of the second sensor device or if the directly successively registered changes in the capacitive coupling of at least one sensor structure to the surroundings and in the capacitive coupling of this sensor structure to the reference electrode are implausible.

28. The operator control device according to claim 4, wherein registering the second electrical potential change comprises:
maintaining, throughout a seventh time period, the second sensor structure at the first constant electrical potential and the reference capacitor at the second constant electrical potential;
electrically connecting, throughout an eighth time period subsequent to the seventh time period, the second sensor structure and the reference capacitor together;
registering, during a ninth time period subsequent to the eighth time period, a third resulting electrical potential of the second sensor structure;
maintaining, throughout a tenth time period subsequent to the ninth time period, the second sensor structure at the second constant electrical potential and the reference capacitor at the first constant electrical potential;

electrically connecting, throughout an eleventh time period subsequent to the tenth time period, the second sensor structure and the reference capacitor together; and registering, during a twelfth time period subsequent to the eleventh time period, a fourth resulting electrical potential of the second sensor structure, wherein the second electrical potential change comprises a difference between the third resulting electrical potential and the fourth resulting electrical potential.

* * * * *

UNITED STATES PATENT AND TRADEMARK OFFICE
CERTIFICATE OF CORRECTION

PATENT NO. : 11,424,743 B2
APPLICATION NO. : 15/748429
DATED : August 23, 2022
INVENTOR(S) : Sascha Staude Page 1 of 1

It is certified that error appears in the above-identified patent and that said Letters Patent is hereby corrected as shown below:

On the Title Page

In Section OTHER PUBLICATIONS, Page 2, the word "Sennan" should read -- German --.

In the Claims

At Column 22, Claim number 28, Line number 48, "claim 4" should read -- claim 1 --.

Signed and Sealed this
Eighth Day of November, 2022

Katherine Kelly Vidal
*Director of the United States Patent and Trademark Office*